(12) United States Patent
Sakuma et al.

(10) Patent No.: US 12,261,221 B2
(45) Date of Patent: Mar. 25, 2025

(54) TRANSISTOR, SEMICONDUCTOR MEMORY DEVICE, AND MANUFACTURING METHOD FOR TRANSISTOR

(71) Applicant: Kioxia Corporation, Tokyo (JP)

(72) Inventors: Kiwamu Sakuma, Mie (JP); Taro Shiokawa, Aichi (JP); Keiko Sakuma, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 353 days.

(21) Appl. No.: 17/686,215

(22) Filed: Mar. 3, 2022

(65) Prior Publication Data

US 2023/0103593 A1 Apr. 6, 2023

(30) Foreign Application Priority Data

Sep. 21, 2021 (JP) ................... 2021-153213

(51) Int. Cl.
*H01L 29/786* (2006.01)
*H01L 29/66* (2006.01)
*H10B 12/00* (2023.01)
*H10B 41/35* (2023.01)
*H10B 43/35* (2023.01)

(52) U.S. Cl.
CPC .. *H01L 29/78642* (2013.01); *H01L 29/66969* (2013.01); *H01L 29/7869* (2013.01); *H01L 29/78696* (2013.01); *H10B 12/30* (2023.02); *H10B 41/35* (2023.02); *H10B 43/35* (2023.02)

(58) Field of Classification Search
None
See application file for complete search history.

(56) References Cited

U.S. PATENT DOCUMENTS

| 5,616,511 | A | 4/1997 | Hirota |
| 5,627,390 | A * | 5/1997 | Maeda ............... H01L 27/0688 |
| | | | 257/302 |
| 9,502,431 | B2 | 11/2016 | Sakuma et al. |

(Continued)

FOREIGN PATENT DOCUMENTS

| JP | H01-225147 A | 9/1989 |
| JP | H05-029577 A | 2/1993 |

(Continued)

OTHER PUBLICATIONS

Shosuke Fujii et al., "Oxide-semiconductor Channel Transistor DRAM (OCTRAM) with 4F2 Architecture", 70th International Electron Devices Meeting, Dec. 9, 2024, San Francisco, CA, U.S.A. (4 pages).

*Primary Examiner* — Cory W Eskridge
(74) *Attorney, Agent, or Firm* — Foley & Lardner LLP

(57) ABSTRACT

A transistor includes an upper electrode; a lower electrode; a gate electrode disposed between the upper electrode and the lower electrode; and a columnar portion penetrating the gate electrode and provided between the upper electrode and the lower electrode. The columnar portion includes a tubular gate insulating film and a semiconductor layer, the tubular gate insulating film disposed at a first distance away from the upper electrode and in contact with the gate electrode. The semiconductor layer is embedded in the tubular gate insulating film and between the gate insulating film and the upper electrode and in contact with the upper electrode.

13 Claims, 12 Drawing Sheets

(56) References Cited

U.S. PATENT DOCUMENTS

| | | | |
|---|---|---|---|
| 9,698,272 B1* | 7/2017 | Ikeda | H01L 29/78642 |
| 9,780,170 B2 | 10/2017 | Ota et al. | |
| 9,818,757 B2 | 11/2017 | Ikeda et al. | |
| 2012/0280303 A1* | 11/2012 | Kiyotoshi | H10B 41/35 |
| | | | 257/E21.422 |
| 2017/0040416 A1* | 2/2017 | Ota | H10B 43/50 |
| 2019/0058008 A1 | 2/2019 | Yagishita et al. | |
| 2019/0237581 A1* | 8/2019 | Saito | H01L 29/78642 |
| 2020/0135242 A1 | 4/2020 | Arai et al. | |
| 2021/0036011 A1 | 2/2021 | Son et al. | |
| 2023/0088455 A1* | 3/2023 | Shiokawa | H10B 12/05 |
| | | | 257/43 |

FOREIGN PATENT DOCUMENTS

| | | |
|---|---|---|
| JP | H05-067730 A | 3/1993 |
| JP | H05-175450 A | 7/1993 |
| JP | H05-226609 A | 9/1993 |
| JP | H05-259387 A | 10/1993 |
| JP | H06-151753 A | 5/1994 |
| JP | H07-045788 A | 2/1995 |

* cited by examiner

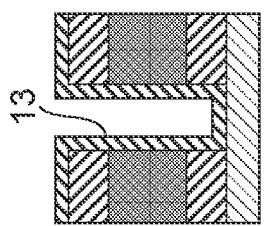
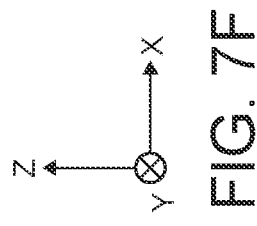
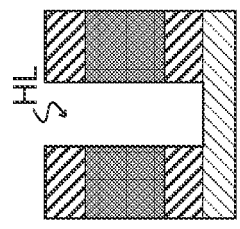
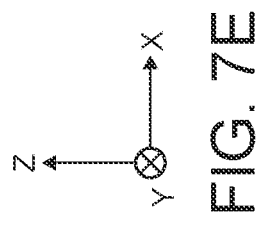
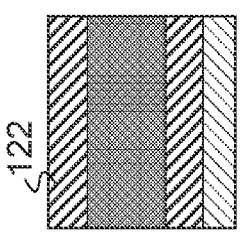
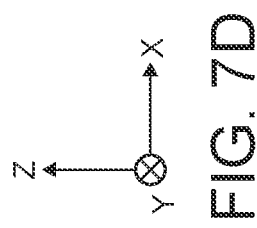
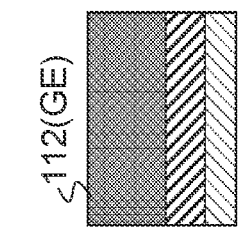
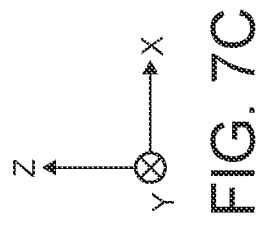
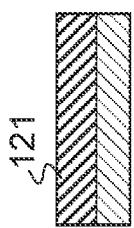
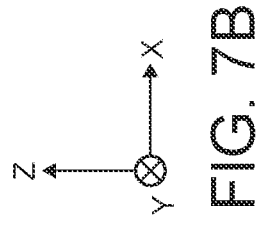
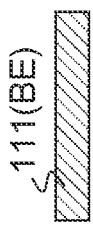
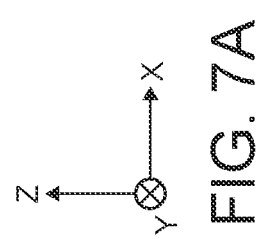
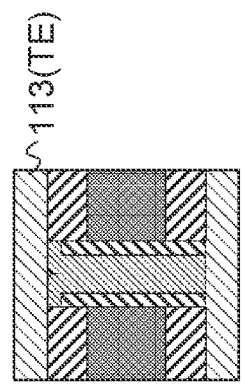
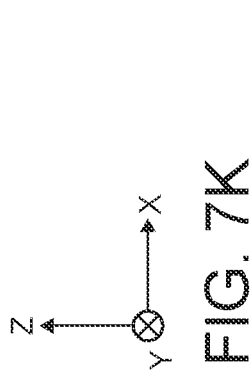
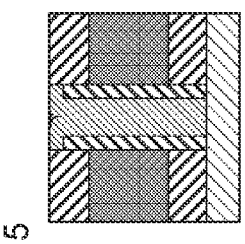
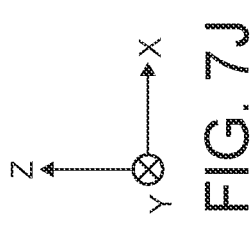
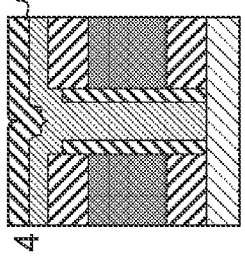
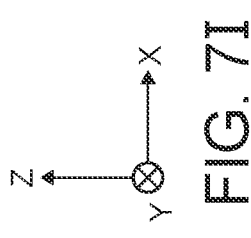
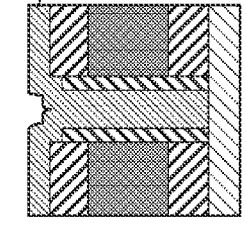
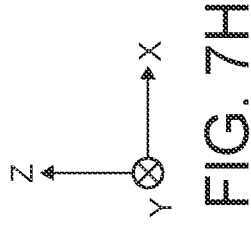
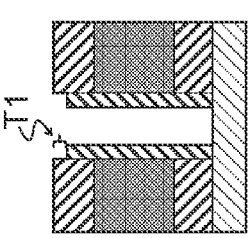
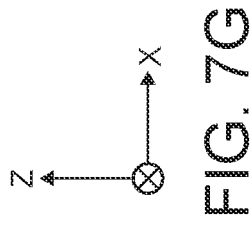

US 12,261,221 B2

TRANSISTOR, SEMICONDUCTOR MEMORY DEVICE, AND MANUFACTURING METHOD FOR TRANSISTOR

CROSS-REFERENCE TO RELATED APPLICATION

This application is based upon and claims the benefit of priority from Japanese Patent Application No. 2021-153213, filed Sep. 21, 2021, the entire contents of which are incorporated herein by reference.

FIELD

Embodiments described herein relate generally to a transistor, a semiconductor memory device, and a manufacturing method for a transistor.

BACKGROUND

In recent years, vertical transistors have attracted attention as a transistor capable of low power consumption and high integration.

DESCRIPTION OF THE DRAWINGS

FIGS. 7A-7K are process diagrams illustrating an example of the manufacturing method for the transistor of the first embodiment.

DETAILED DESCRIPTION

Figure 1:
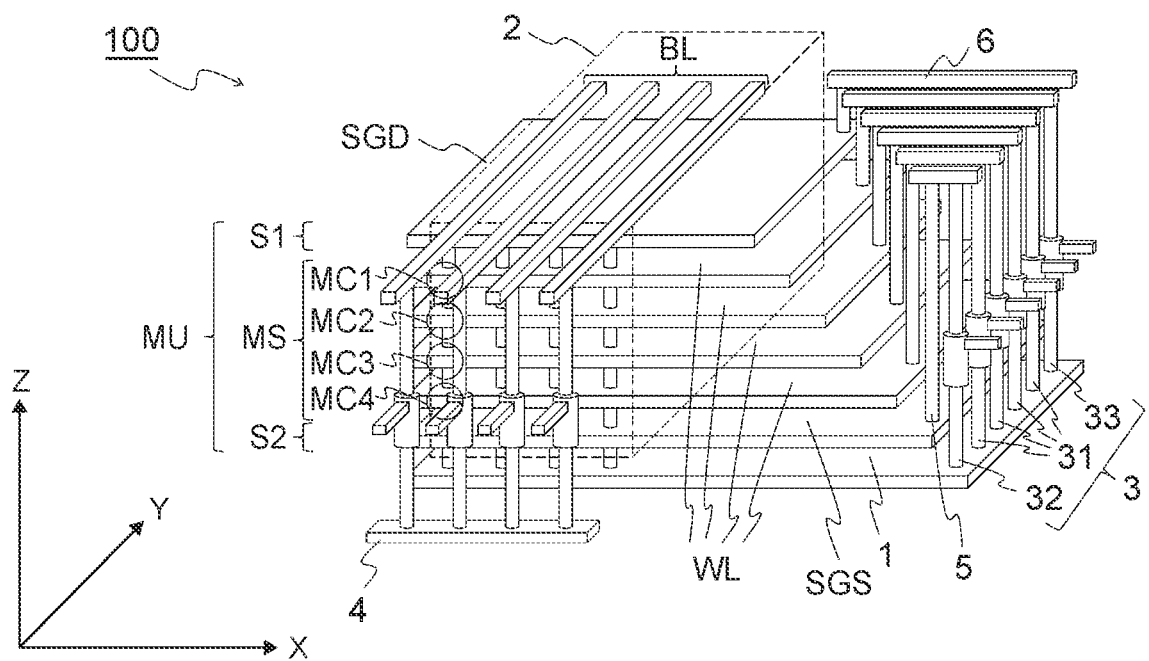
FIG. 1 is a perspective view schematically illustrating an example of the structure of a semiconductor memory device of a first embodiment.

Embodiments provide improvements in transistor characteristics.

In general, according to at least one embodiment, a transistor includes: an upper electrode; a lower electrode; a gate electrode disposed between the upper electrode and the lower electrode; and a columnar portion penetrating the gate electrode and disposed between the upper electrode and the lower electrode. The columnar portion includes a tubular gate insulating film and a semiconductor layer, the tubular gate insulating film disposed at a first distance away from the upper electrode and in contact with the gate electrode, the semiconductor layer embedded in the gate insulating film and between the gate insulating film and the upper electrode and in contact with the upper electrode.

Hereinafter, embodiments for carrying out the disclosure will be described with reference to the drawings. The drawings are schematic. For example, thickness-planar dimension relationships, the ratio of the thickness of each layer, and so on may differ from the actual ones. In addition, in the embodiments, substantially identical components are denoted by the same reference numerals with redundant description omitted.

1. First Embodiment

A first embodiment will be described with reference to FIGS. 1 to 8 and FIGS. 15.

1.1. Configuration 1.1.1. Configuration of Semiconductor Memory device

FIG. 1 is a perspective view schematically illustrating an example of the structure of the semiconductor memory device of the first embodiment. In at least one embodiment, a semiconductor memory device 100 is a nonvolatile semiconductor memory device such as a NAND flash memory. As illustrated in FIG. 1, the semiconductor memory device 100 has a substrate 1, a memory cell array 2, a word line WL, a bit line BL, a drive circuit 3, a sense amplifier 4, a source-side select gate line SGS, and a drain-side select gate line SGD.

The memory cell array 2 includes a plurality of memory cell units MU above the substrate 1. The memory cell unit MU has a memory string MS, a drain-side select transistor S1, and a source-side select transistor S2. In the memory string MS, a plurality of memory cells MC (MC1 to MC4) (memory transistors) are connected in series. The drain-side select transistor S1 and the source-side select transistor S2 are respectively connected to both ends of the memory string MS. Although four memory cells MC are provided in one memory string MS in FIG. 1, the number of memory cells MC provided in one memory string MS is not limited thereto. Of the memory cells MC in the memory string MS, one or more memory cells MC close to the source-side select gate line SGS and the drain-side select gate line SGD may be dummy cells not used for valid data storage. The number of dummy cells is freely selected.

The word line WL is connected in common to the memory cells MC adjacent to each other in the X direction in FIG. 1. In addition, the source-side select gate line SGS is connected in common to the source-side select transistors S2 adjacent to each other in the X direction. The drain-side select gate line SGD is connected in common to the drain-side select transistors S1 adjacent to each other in the X direction.

The word line WL, the source-side select gate line SGS, and the drain-side select gate line SGD are processed so as to be stepped in the end portion in the X direction. As a result, each of the word line WL, the source-side select gate line SGS, and the drain-side select gate line SGD can be independently connected to a contact plug 5. The contact plug 5 extends from the upper surface of the end portion of each of the word line WL, the source-side select gate line SGS, and the drain-side select gate line SGD processed so as to be stepped. Further, an upper layer wiring 6 is formed at the upper end of the contact plug 5. A word line drive circuit 31, a source-side select gate line drive circuit 32, and a drain-side select gate line drive circuit 33 are connected to the word line WL, the source-side select gate line SGS, and the drain-side select gate line SGD via the contact plug 5 respectively. Although the word line WL, the source-side select gate line SGS, and the drain-side select gate line SGD are processed so as to be stepped in the X-direction end portion of the memory cell array 2 in FIG. 1, the word line WL, the source-side select gate line SGS, and the drain-side select gate line SGD may be processed so as to be stepped so as to surround the entire periphery of the memory cell array 2 including the Y-direction end portion of the memory cell array 2.

The bit lines BL are located at predetermined intervals in the X direction with the Y direction, which intersects with the X direction, serving as a long side. The bit line BL is connected to the plurality of memory strings MS via the drain-side select transistor S1.

A source line SL (not illustrated in FIG. 1) is disposed with, for example, its long side extending in the Y direction. The source line SL is connected to the plurality of memory strings MS via the source-side select transistor S2.

The drive circuit 3 has the word line drive circuit 31, the source-side select gate line drive circuit 32, and the drain-side select gate line drive circuit 33. The word line drive circuit 31 controls the voltage that is applied to the word line WL. The source-side select gate line drive circuit 32 controls the voltage that is applied to the source-side select gate line SGS. The drain-side select gate line drive circuit 33 controls the voltage that is applied to the drain-side select gate line SGD.

The sense amplifier 4 is a circuit amplifying a signal read from the selected memory cell MC to the bit line BL.

1.1.2. Configuration of Memory Cell Array

Figure 2:
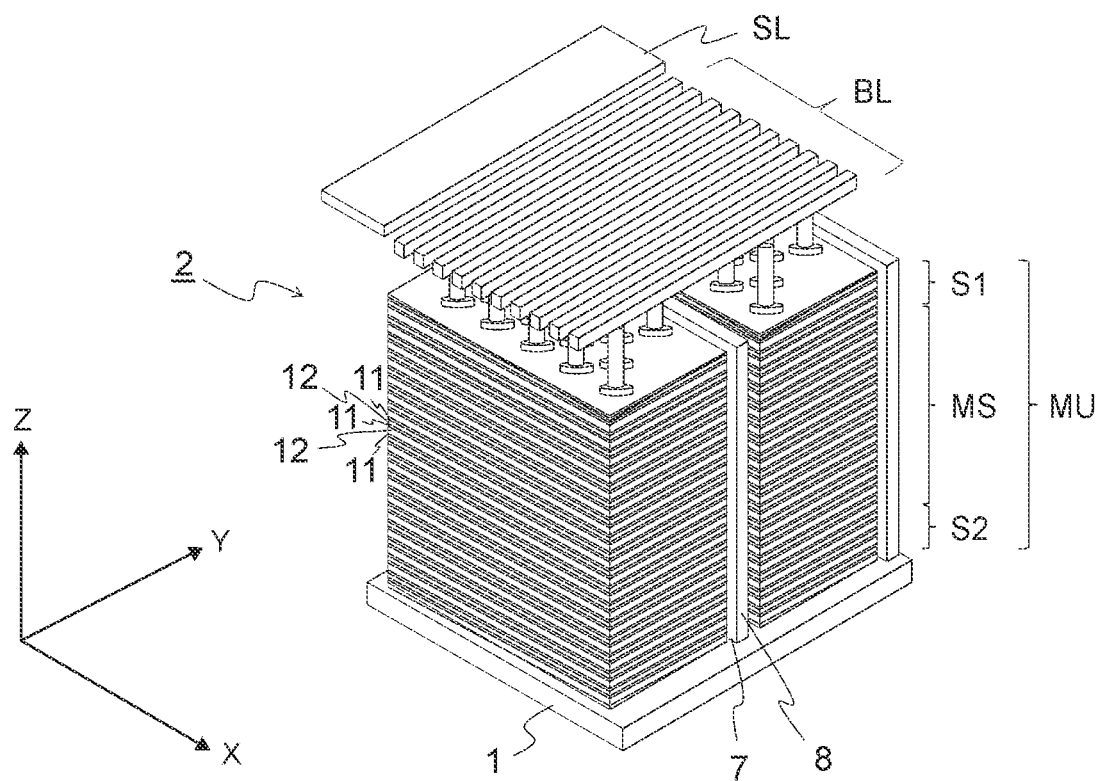
FIG. 2 is a perspective view illustrating the structure of a part of a memory cell array of the first embodiment.
Figure 3:
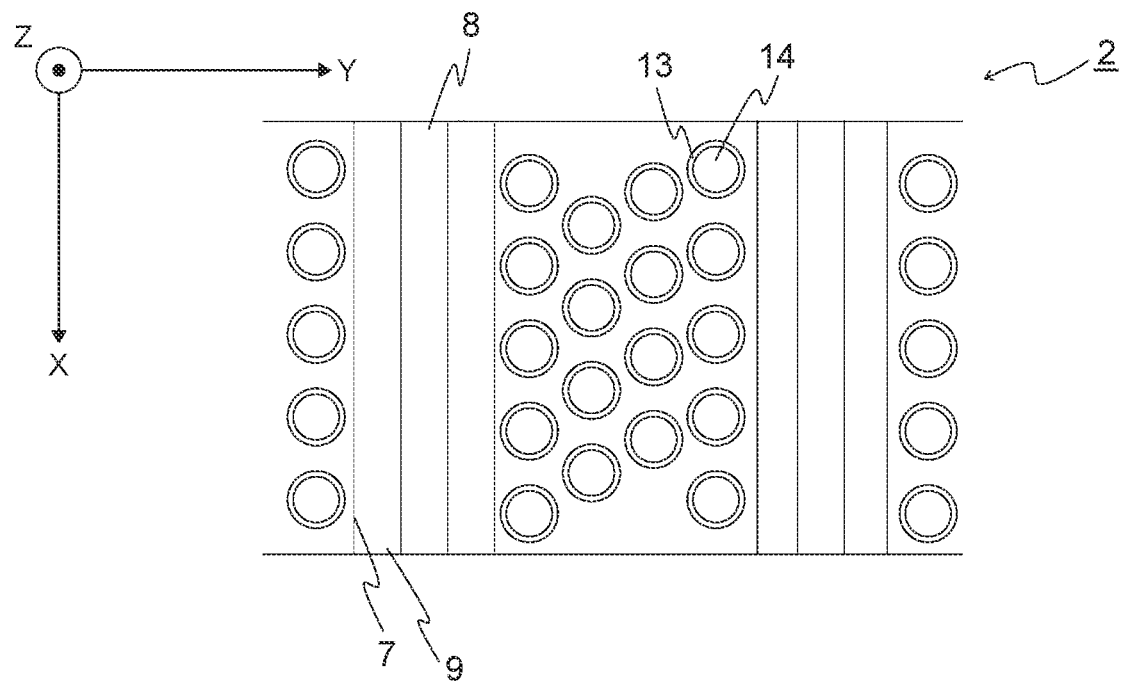
FIG. 3 is a plan view illustrating a part of the memory cell array of the first embodiment.

FIG. 2 is a perspective view illustrating the structure of a part of the memory cell array of the first embodiment. FIG. 3 is a plan view illustrating a part of the memory cell array of the first embodiment. An example of the configuration of the memory cell array will be described with reference to FIGS. 2 and 3. Illustrated in FIG. 1 is a case where four layers of word line WL, one layer of source-side select gate line SGS, and one layer of drain-side select gate line SGD, that is, a total of six layers of conductive film 11 are provided. Illustrated in FIG. 2 is a case where 27 layers of word line WL, four layers of source-side select gate line SGS, and four layers of drain-side select gate line SGD, that is, a total of 35 layers of conductive film 11 are provided.

The memory cell array 2 has a structure in which the conductive films 11 and interlayer insulating films 12 are alternately stacked above the substrate 1 along the Z direction, which intersects with each of the X and Y directions. The conductive film 11 functions as a memory cell control gate (word line WL), the source-side select gate line SGS, and the drain-side select gate line SGD. The conductive film 11 is, for example, tungsten (W), titanium nitride (TiN), or the like. The interlayer insulating films 12 are disposed above and below the conductive film 11 and electrically insulate the conductive films 12 from each other. The interlayer insulating film 12 is, for example, silicon oxide (SiO$_2$) or the like.

In addition, the stacked body of the interlayer insulating film 12 and the conductive film 11 in the memory cell array 2 is divided into blocks. The block is the minimum unit of data erasure. A trench 7 is formed at the boundary of the divided blocks. An interlayer insulating layer 9 (not illustrated in FIG. 2) is embedded in the trench 7. Further, a source contact 8 is formed through the interlayer insulating layer 9. The source contacts 8 are formed at predetermined intervals in the Y direction with the X direction serving as a long side. The lower end of the source contact 8 is connected to the substrate 1, and the upper end of the source contact 8 is connected to the source line SL.

A semiconductor layer 14 functions as a channel for the memory cell, the drain-side select transistor S1, and the source-side select transistor S2. The semiconductor layers 14 are, for example, aligned in a diagonal direction with respect to the X direction and the Y direction in a line. One bit line BL extending in the Y direction is connected to any one of the semiconductor layers 14 arranged in the diagonal direction. As a result, only one memory string MS in one region sandwiched between two source contacts 8 can be connected to one bit line BL. However, the arrangement illustrated in FIG. 3 is merely an example and the semiconductor layers 14 may be aligned in the X direction and the Y direction.

In addition, the semiconductor layers 14 are located at predetermined intervals in the XY plane so as to penetrate the stacked body of the interlayer insulating film 12 and the conductive film 11 in the Z direction. The upper end of the semiconductor layer 14 is connected to the bit line BL via a contact. In addition, the lower end of the semiconductor layer 14 is electrically connected to the substrate 1. The lower end of the semiconductor layer 14 is connected to the source line SL via the substrate 1 and the source contact 8.

In at least one embodiment, the semiconductor layer 14 is, for example, an oxide semiconductor. The oxide semiconductor contains, for example, indium oxide, gallium oxide, and zinc oxide. The oxide semiconductor containing indium oxide, gallium oxide, and zinc oxide as described above is referred to as In—Ga—Zn oxide (IGZO). In addition, an oxide containing at least one of indium, zinc, and tin (e.g. InO, InZnO, InSnO, Sno, Zno, and ZnSnO) may be used as the oxide semiconductor.

A gate insulating film 13 is provided around the semiconductor as to surround the layer 14 so semiconductor layer 14. The gate insulating film 13 is, for example, silicon oxide (SiO$_2$).

1.1.3. Configuration of Transistor

Figure 4:
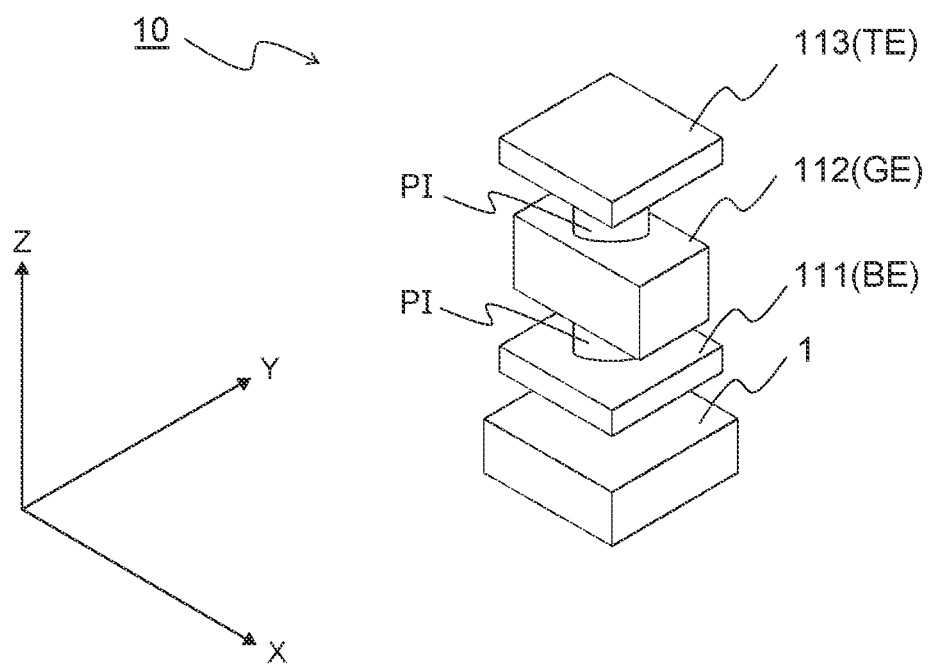
FIG. 4 is a perspective view illustrating an example of the configuration of a transistor of the first embodiment.

FIG. 4 is a perspective view illustrating an example of the configuration of the transistor of the first embodiment.

A transistor 10 is used as a memory cell (memory transistor) in at least one embodiment. As illustrated in FIG. 4, the transistor 10 includes a conductive film 111 as a lower electrode BE, a conductive film 112 as a gate electrode GE, a conductive film 113 as an upper electrode TE, and a columnar portion PI. Although the source-side select gate line SGS is disposed between the conductive film 111 and the substrate 1, the source-side select gate line SGS is not illustrated in FIG. 4. The transistor 10 of FIG. 4 is the transistor at the top of FIG. 1. That is, the transistor 10 of FIG. 4 is the drain side selection transistor S1 of FIG. 1. However, the transistor 10 of FIG. 4 may be the memory cell MC.

Each of the conductive film 111 and the conductive film 113 functions as a source electrode or a drain electrode of the transistor 10. The conductive film 111 is, for example, provided above the substrate 1. The conductive film 113 is provided above the conductive film 111. For example, indium tin oxide (ITO), tungsten (W), or the like is used for the conductive film 111 and the conductive film 113.

The conductive film 112 functions as a gate electrode of the transistor 10. The conductive film 112 is provided between the conductive film 113 as the upper electrode TE and the conductive film 111 as the lower electrode BE. For example, tungsten (W), titanium nitride (TiN), or the like is used for the conductive film 112.

The columnar portion PI has the semiconductor layer 14 and the gate insulating film 13. The columnar portion PI is provided in, for example, a columnar shape extending in the Z direction. In addition, the columnar portion PI penetrates the conductive film 112 and is provided between the conductive film 111 and the conductive film 113. The lower end of the columnar portion PI is electrically connected to the conductive film 111, and the upper end of the columnar portion PI is electrically connected to the conductive film 113.

In this manner, the transistor 10 is referred to as, for example, a vertical transistor because a current flows via the columnar portion PI extending in the Z direction between the conductive film 111 as the lower electrode BE and the conductive film 113 as the upper electrode TE.

Figure 5:
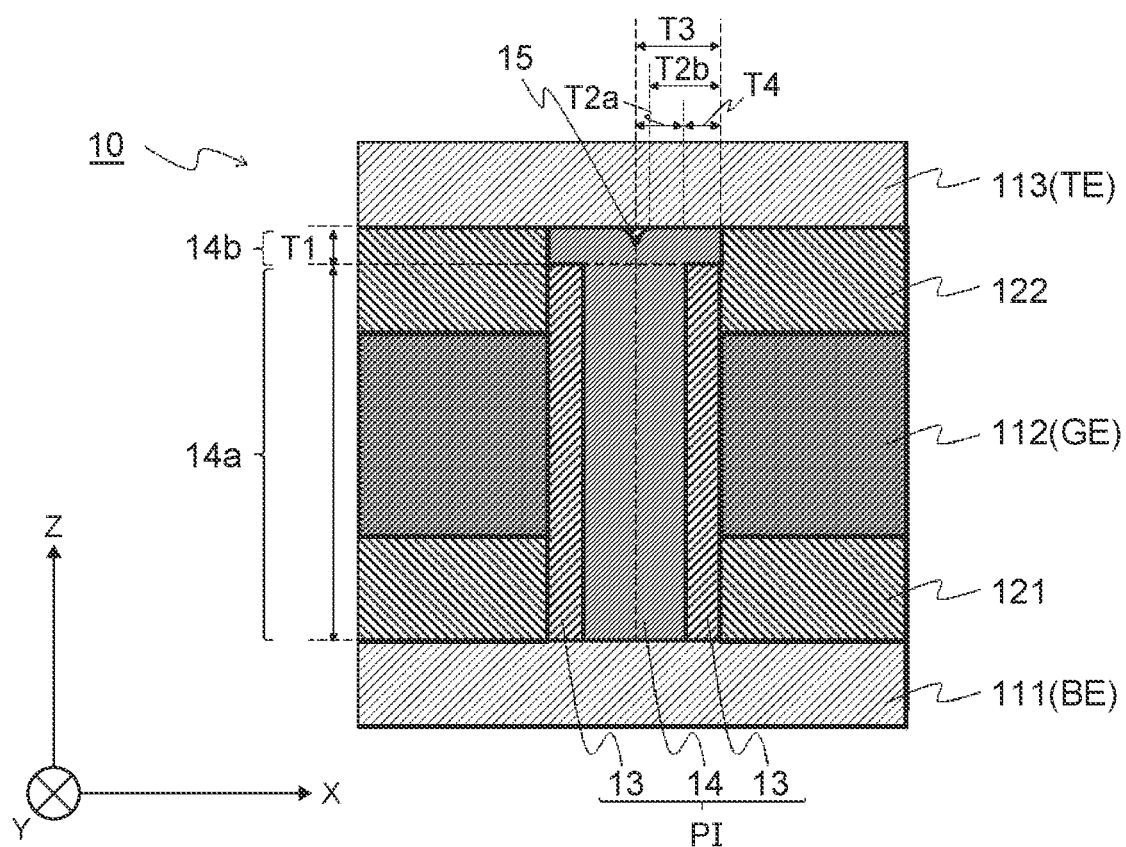
FIG. 5 is a cross-sectional view illustrating an example of the configuration of the transistor of the first embodiment.

FIG. 5 is a cross-sectional view illustrating an example of the configuration of the transistor of the first embodiment. A more detailed configuration of the transistor 10 will be described with reference to FIG. 5.

As illustrated in FIG. 5, the transistor 10 includes the conductive film 111 as the lower electrode BE, an interlayer insulating film 121 as a first insulating film, the conductive film 112 as the gate electrode GE, an interlayer insulating film 122 as a second insulating film, the conductive film 113 as the upper electrode TE, and the columnar portion PI.

The interlayer insulating film 121 is provided on the conductive film 111. The conductive film 112 is provided on the interlayer insulating film 121. The interlayer insulating film 122 is provided on the conductive film 112. The conductive film 113 is provided on the interlayer insulating film 122. The columnar portion PI extending in the Z direction is provided between the conductive film 111 and the conductive film 113.

In the columnar portion PI, the gate insulating film 13 is provided in a cylindrical shape and is in contact with the conductive film 112 as the gate electrode GE. The upper end of the gate insulating film 13 is separated by a first distance T1 from the lower end of the conductive film 113 as the upper electrode TE. The lower end of the gate insulating film 13 is in contact with the conductive film 111. For example, silicon oxide ($SiO_2$) or the like is used for the gate insulating film 13.

Figure 15:
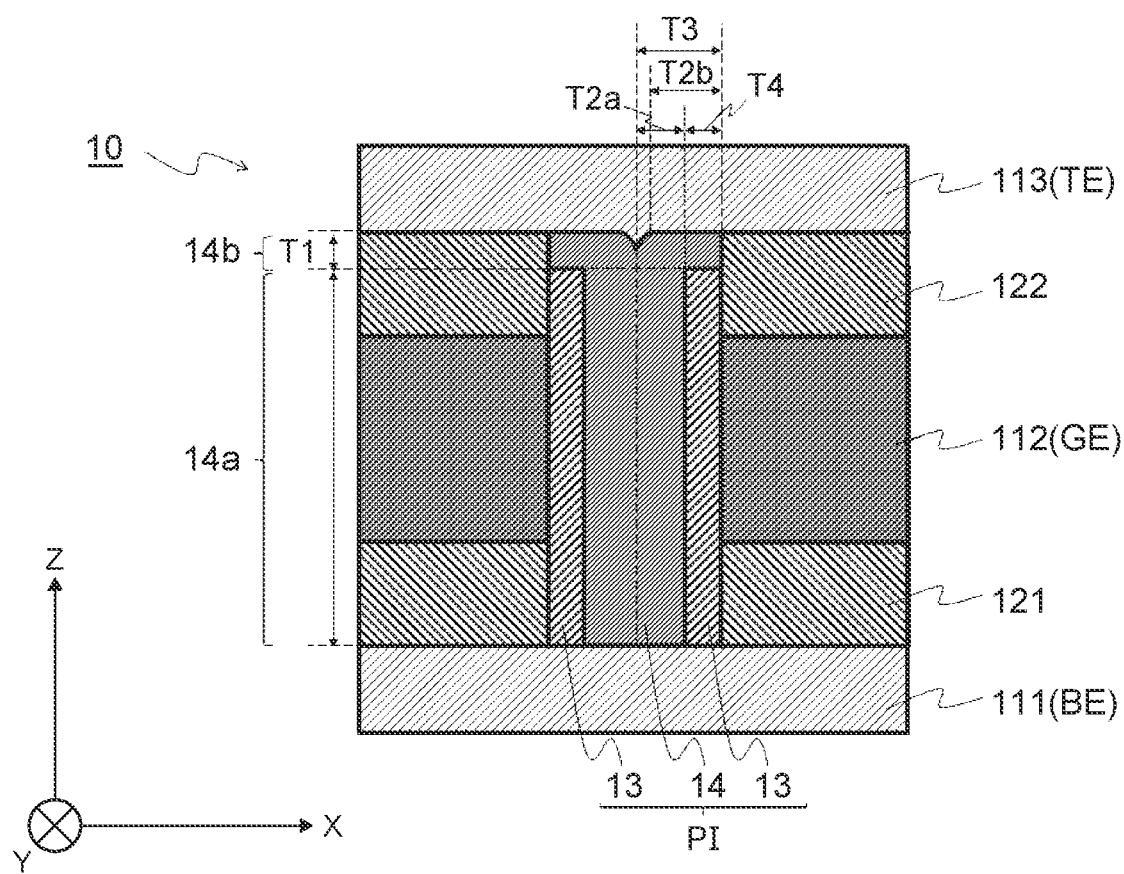
FIG. 15 is a perspective view schematically illustrating an example of the structure of a semiconductor memory device of an alternative example of the first embodiment.

The semiconductor layer 14 is basically embedded in the gate insulating film 13 provided in a cylindrical shape. The upper end of the semiconductor layer 14 is in contact with the conductive film 113. Although the upper end of the semiconductor layer 14 is in contact with the conductive film 113 in at least one embodiment, the upper end of the semiconductor layer 14 may be in contact with the conductive film 113 via a contact. The lower end of the semiconductor layer 14 is in contact with the conductive film 111. In other words, the upper end of the semiconductor layer 14 is higher than the upper end of the gate insulating film 13. Accordingly, the semiconductor layer 14 has a part 14a embedded in the gate insulating film 13 and a part 14b embedded between the gate insulating film 13 and the conductive film 113 as the upper electrode TE. The part 14a of the semiconductor layer 14 embedded in the gate insulating film 13 is insulated from the conductive film 112 by the gate insulating film 13. In addition, a recess portion is formed in the middle of the semiconductor layer 14. An embedded insulating film 15 is formed in the recess portion. FIG. 15 is a perspective view schematically illustrating an example of the structure of a semiconductor memory device of an alternative example of the first embodiment. As shown in FIG. 15, the embedded insulating film 15 may not be formed in the recess portion.

In at least one embodiment, the thickness of a film in the XY plane is referred to as the film diameter. A film diameter T2a of the part 14a of the semiconductor layer 14 embedded in the gate insulating film 13 is represented by T2a=a radius T3 of the columnar portion PI—a film diameter T4 of the gate insulating film 13. In addition, a film diameter T2b of the part 14b of the semiconductor layer 14 embedded between the gate insulating film 13 and the conductive film 113 is preferably larger than the film diameter T2a of the part 14a of the semiconductor layer 14 embedded in the gate insulating film 13 and smaller than the radius T3 of the columnar portion PI. In other words, the film diameter T2a of the part 14a of the semiconductor layer 14 embedded in the gate insulating film 13, the film diameter T2b of the part 14b of the semiconductor layer 14 embedded between the gate insulating film 13 and the conductive film 113, and the radius T3 of the columnar portion PI have the relationship of T2a<T2b<T3. Further, the distance T1 from the upper end of the gate insulating film 13 to the lower end of the conductive film 113 is preferably equal to or less than the film diameter T2a of the part 14a of the semiconductor layer 14 embedded in the gate insulating film 13.

1.2. Manufacturing Method

A manufacturing method for the transistor of the first embodiment will be described with reference to FIGS. 6 and 7.

Figure 6:
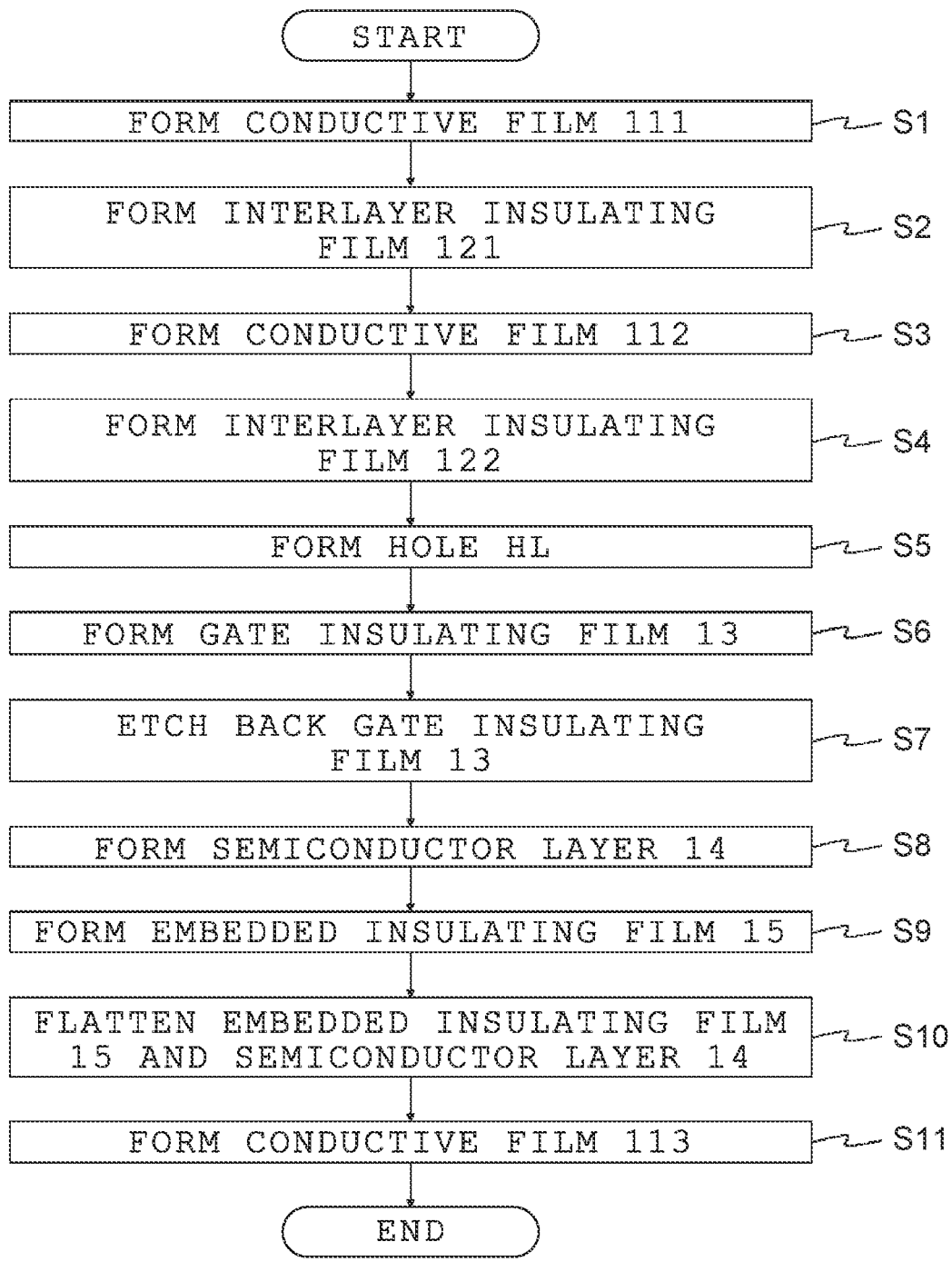
FIG. 6 is a flowchart illustrating an example of a manufacturing method for the transistor of the first embodiment.

FIG. 6 is a flowchart illustrating an example of the manufacturing method for the transistor of the first embodiment. FIG. 7 is a process diagram illustrating an example of the manufacturing method for the transistor of the first embodiment. Hereinafter, an example of the manufacturing method for the transistor 10 according to the first embodiment will be described from the formation of the conductive film 111 as the lower electrode BE to the formation of the conductive film 113 as the upper electrode TE with reference to FIGS. 6 and 7.

First, in Step S1, the conductive film 111 as the lower electrode BE is formed above the substrate 1 (not illustrated in FIG. 7) as illustrated in FIG. 7A. For example, sputtering is used for the formation of the conductive film 111.

Next, in Step S2, the interlayer insulating film 121 as the first insulating film is formed on the conductive film 111 as illustrated in FIG. 7B. For example, sputtering is used for the formation of the interlayer insulating film 121.

Next, in Step S3, the conductive film 112 as the gate electrode GE is formed on the interlayer insulating film 121 as illustrated in FIG. 7C.

Next, in Step S4, the interlayer insulating film 122 as the second insulating film is formed on the conductive film 112 as illustrated in FIG. 7D.

Next, in Step S5, a hole HL corresponding to the columnar portion PI is formed as illustrated in FIG. 7E. In other words, the radius T3 of the columnar portion PI is equal to the radius of the hole HL. The hole HL is formed by, for example, photolithography and anisotropic etching so as to penetrate the interlayer insulating film 121, the conductive film 112, and the interlayer insulating film 122 and reach the upper surface of the conductive film 111. For example, reactive ion etching (RIE) is used as the anisotropic etching.

Next, in Step S6, the gate insulating film 13 is formed on the side wall of the hole HL as illustrated in FIG. 7F. Specifically, first, the gate insulating film 13 is formed on each of the upper surface of the interlayer insulating film 122, the side wall of the hole HL, and the upper surface of a part of the conductive film 111 as the bottom surface of the hole HL by, for example, chemical vapor deposition (CVD) or the like.

Next, in Step S7, the gate insulating film 13 formed on, for example, each of the interlayer insulating film 122 and the upper surface of the part of the conductive film 111 as the bottom surface of the hole HL is removed by etching back the entire surface by anisotropic etching such as RIE. Then, as illustrated in FIG. 7G, the gate insulating film 13 at a part of the side wall of the hole HL is further removed by etch back. In the present embodiment, the gate insulating film 13 on the side wall of the hole HL is removed up to the position where the distance from the upper end of the interlayer insulating film 122 to the upper end of the gate insulating film 13 is T1. As a result, the height of the semiconductor layer 14 becomes higher than the height of the gate insulating film 13 by a process to be described later. After the etch back, the upper surface of the interlayer insulating film 122 may be flattened by chemical mechanical polishing (CMP).

Next, in Step S8, the semiconductor layer 14 is formed as illustrated in FIG. 7H. Specifically, the semiconductor layer 14 is embedded in the hole HL and on the gate insulating film 13 by, for example, atomic layer deposition (ALD) or the like and comes into contact with the conductive film 111 as the lower electrode BE on the bottom surface of the hole HL. In the present embodiment, the semiconductor layer 14 is also formed on the interlayer insulating film 122 as the semiconductor layer 14 is formed in the hole HL. In addition, the recess portion where the embedded insulating film 15 can be embedded in, for example, a step to be described later is formed in the middle portion of the semiconductor layer 14 on the side of the conductive film 113 as the upper electrode TE.

Next, in Step S9, the embedded insulating film 15 is formed as illustrated in FIG. 7I. Specifically, the embedded insulating film 15 is formed in the middle recess portion of the semiconductor layer 14 and on the semiconductor layer 14 formed in Step S8. By forming the embedded insulating film 15, flattening the step 10 described later becomes easy. In addition, when the embedded insulating film 15 is not formed, step S9 may be omitted.

Subsequently, in Step S10, the semiconductor layer 14 and the embedded insulating film 15 are flattened as illustrated in FIG. 7J. Specifically, the upper surfaces of the semiconductor layer 14 and the embedded insulating film 15 are flattened by, for example, CMP and the height becomes equal to the height of the interlayer insulating film 122.

Then, in Step S11, the conductive film 113 as the upper electrode TE is formed by, for example, sputtering as illustrated in FIG. 7K. As a result, the structure of the transistor 10 according to the first embodiment described with reference to FIG. 5 is formed.

1.3. Effect

A current Id flowing through the channel of the transistor is represented by a drain voltage Vd/(contact resistance Rate of the upper electrode TE+contact resistance Rcbe of the lower electrode BE+channel resistance Rch). Contact resistance Rc is the resistance attributable to the contact between the upper electrode TE and the channel, and the channel and the lower electrode BE.

When annealing is performed in the process of manufacturing the transistor, oxygen preferentially enters from the upper electrode TE side. Accordingly, the oxygen vacancy concentration on the upper electrode TE side of the semiconductor layer is lower than the oxygen vacancy concentration on the lower electrode BE side of the semiconductor layer. Accordingly, the contact resistance on the upper electrode TE side is larger than the contact resistance on the lower electrode BE side (Rcte>Rcbe). Accordingly, the transistor characteristics are different between a case where the upper electrode TE is a drain electrode and the lower electrode BE is a source electrode and a case where the upper electrode TE is a source electrode and the lower electrode BE is a drain electrode.

In addition, when the contact diameter of the source electrode/drain electrode falls below, for example, approximately 40 nm as a result of miniaturization, the value of the contact resistance becomes dominant in the current Id. In the miniaturization, the current Id can be increased by reducing the contact resistance.

Hereinafter, the effect of the present embodiment will be described using a comparative example.

Figure 8:
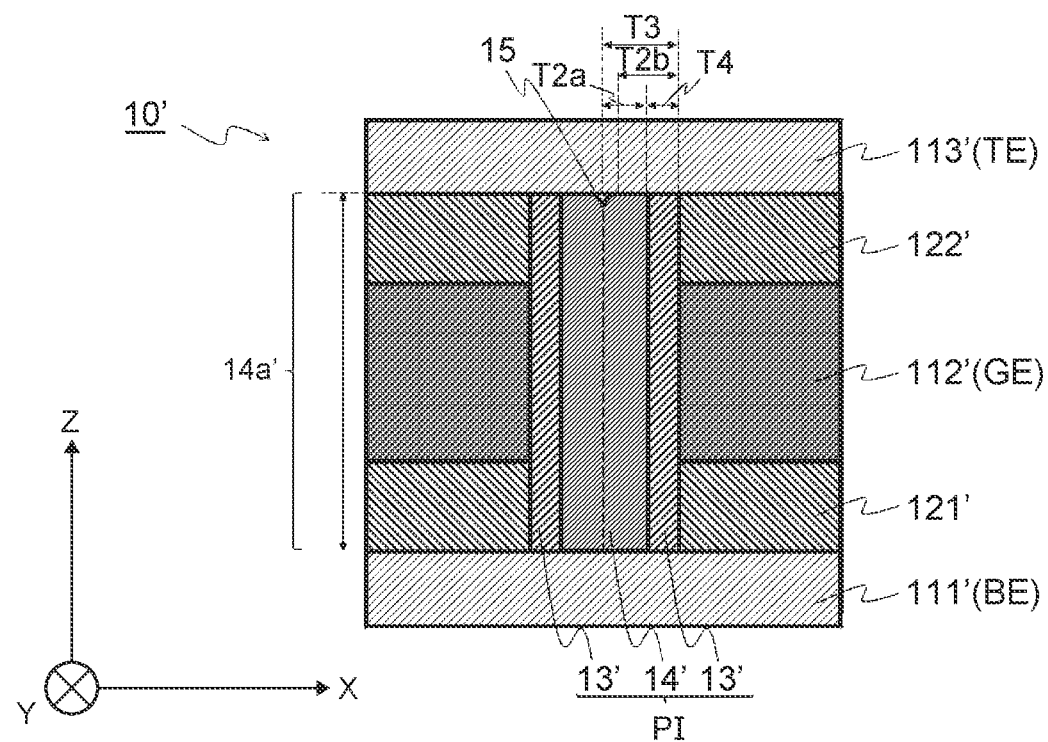
FIG. 8 is a cross-sectional view illustrating a comparative example of the transistor of the first embodiment.

FIG. 8 is a cross-sectional view illustrating the comparative example of the transistor of the first embodiment. As illustrated in FIG. 8, a transistor 10' includes a conductive film 111' as the lower electrode BE, an interlayer insulating film 121', a conductive film 112' as the gate electrode GE, a conductive film 113' as the upper electrode TE, an interlayer insulating film 122', and the columnar portion PI. The columnar portion PI includes a gate insulating film 13' and a semiconductor layer 14'. The heights of the gate insulating film 13' and the semiconductor layer 14' are equal to each other, and the upper ends of the gate insulating film 13' and the semiconductor layer 14' are in contact with the conductive film 113' as the upper electrode TE. The other configurations are similar to those of the transistor 10 described with reference to FIG. 5 and the description thereof will be omitted.

In at least one embodiment, the upper end of the gate insulating film 13 is lower than the upper end of the semiconductor layer 14 and the semiconductor layer 14 is provided between the gate insulating film 13 and the conductive film 113 as the upper electrode TE. Accordingly, the area of contact of the semiconductor layer 14 with the upper electrode TE can be increased as compared with the transistor 10' of the comparative example and the resistance on the upper electrode TE side can be reduced. Specifically, the film diameter of the semiconductor layer 14 coming into contact with the upper electrode TE is $T2b$ in at least one embodiment whereas the film diameter of the semiconductor layer 14' coming into contact with the upper electrode TE is $T2a$ in the comparative example. Accordingly, the area of contact with the upper electrode TE can be increased by approximately $(T2b^{\wedge}2 - T2a^{\wedge}2)\pi$.

From the above, according to at least one embodiment, the height of the gate insulating film 13 is made lower than the height of the semiconductor layer 14, the semiconductor layer 14 is provided between the gate insulating film 13 and the conductive film 113 as the upper electrode TE, and thus the resistance Rcte on the upper electrode TE side of the semiconductor layer 14 can be reduced and the current Id flowing through the channel of the transistor can be increased. In addition, the difference between the contact resistance Rcte on the upper electrode TE side and the contact resistance Rcbe on the lower electrode BE side can be reduced. In other words, the transistor characteristics can be improved. Further, a more remarkable effect can be obtained at a contact diameter at which the contact resistance Rc is dominant with respect to the current Id flowing through the channel of the transistor.

In addition, in at least one embodiment, the film diameter T2b of the part 14b of the semiconductor layer 14 embedded between the gate insulating film 13 and the conductive film 113 is larger than the film diameter T2a of the part 14a of the semiconductor layer 14 embedded in the gate insulating film 13 and smaller than the radius T3 of the columnar portion PI. Accordingly, the columnar portion PI can be disposed as illustrated in FIG. 3 without the semiconductor layer 14 protruding from the columnar portion PI.

In addition, the distance T1 from the upper end of the gate insulating film 13 to the lower end of the conductive film 113 is equal to or less than the film diameter T2a of the part 14a of the semiconductor layer 14 embedded in the gate insulating film 13. Accordingly, it is possible to prevent a decrease in the area of contact between the semiconductor layer 14 and the upper electrode TE attributable to the embedded insulating film 15 formed in the recess portion of the semiconductor layer 14 and an increase in the length of the semiconductor layer 14 as a channel.

In addition, in the semiconductor memory device 100 including the transistor 10 according to at least one embodiment, the current Id flowing through the channel of the transistor can be increased. Further, an improvement in operating speed can be anticipated from the improvement of the transistor characteristics.

In addition, in the manufacturing method for the transistor 10 according to at least one embodiment, the height of the gate insulating film 13 is lower than the height of the interlayer insulating film 122 and the semiconductor layer 14 is easily embedded by the frontage widening. Accordingly, the occurrence of poor embedding of the semiconductor layer 14 can be prevented.

2. Second Embodiment

Next, a second embodiment will be described. The second embodiment differs from the first embodiment in that the upper electrode TE comes into contact with not only the upper portion of the semiconductor layer but also the side surface and the middle recess portion. The configuration is similar to that of the first embodiment except that the upper electrode TE comes into contact with not only the upper surface of the semiconductor layer but also the side surface and the middle recess portion, and thus the same parts will be denoted by the same reference numerals with redundant description omitted.

2.1. Configuration

Figure 9:
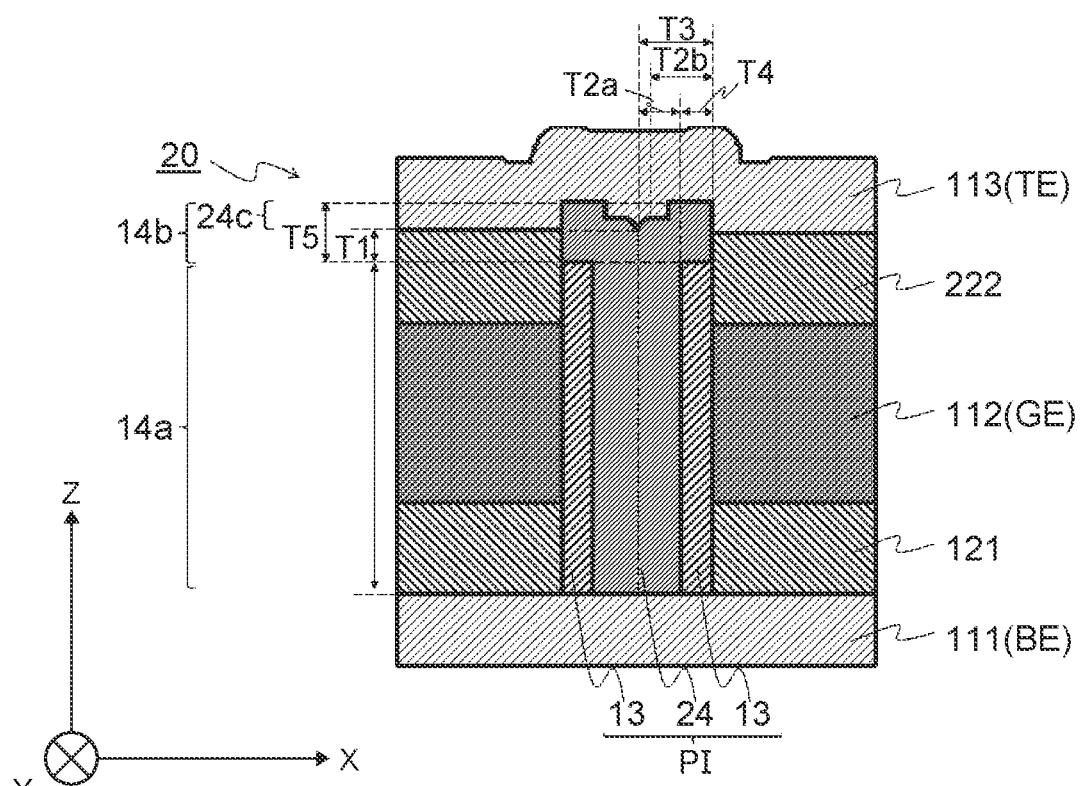
FIG. 9 is a cross-sectional view illustrating an example of the configuration of a transistor of a second embodiment.

The configuration of the transistor of the second embodiment will be described with reference to FIG. 9. FIG. 9 is a cross-sectional view illustrating an example of the configuration of the transistor of the second embodiment.

A transistor 20 is used as a memory cell (memory transistor) in the present embodiment. As illustrated in FIG. 9, the transistor 20 includes the conductive film 111 as the lower electrode BE, the interlayer insulating film 121, the conductive film 112 as the gate electrode GE, an interlayer insulating film 222 as the second insulating film, the conductive film 113 as the upper electrode TE, and the columnar portion PI.

The interlayer insulating film 121 is provided on the conductive film 111. The conductive film 112 is provided on the interlayer insulating film 121. The interlayer insulating film 222 is provided on the conductive film 112. The conductive film 113 is provided on the interlayer insulating film 222. The columnar portion PI extending in the Z direction is provided between the conductive film 111 and the conductive film 113.

Each of the conductive film 111 and the conductive film 113 functions as a source electrode or a drain electrode of the transistor 20. The conductive film 111 is, for example, provided above the substrate 1. The conductive film 113 is provided above the conductive film 111. For example, indium tin oxide (ITO), tungsten (W), or the like is used for the conductive film 111 and the conductive film 113.

The columnar portion PI has a semiconductor layer 24 and the gate insulating film 13. The columnar portion PI is provided in, for example, a columnar shape extending in the Z direction and penetrates the conductive film 112. The lower end of the columnar portion PI is electrically connected to the conductive film 111, and the upper end of the columnar portion PI is electrically connected to the conductive film 113.

In the columnar portion PI, the semiconductor layer 24 has a recess portion in the middle on the side of the conductive film 113 as the upper electrode TE. The conductive film 113 as the upper electrode TE is formed in the recess portion. The lower end of the recess portion is higher than the upper end of the gate insulating film 13. In at least one embodiment, the conductive film 113 as the upper electrode TE is formed in the recess portion, but the embedded insulating film 15 may be formed in the recess portion.

The upper end of the semiconductor layer 24 is in contact with the conductive film 113. In addition, the upper end of the semiconductor layer 24 is higher by a second distance T5 than the upper end of the gate insulating film 13. At least a part of the side surface of the part 14b of the semiconductor layer 24 embedded between the gate insulating film 13 and the conductive film 113 is in contact with the conductive film 113. In at least one embodiment, the side surface of a part 24c of the semiconductor layer 24 higher than the upper end of the interlayer insulating film 222 and not embedded in the gate insulating film 13 is in contact with the conductive film 113. Further, the recess portion of the semiconductor layer 24 is also in contact with the conductive film 113. The lower end of the semiconductor layer 24 is in contact with the conductive film 111. In other words, the upper end of the semiconductor layer 24 is higher than the upper end of the gate insulating film 13. Specifically, the upper end of the semiconductor layer 24 is higher by the second distance T5 than the upper end of the gate insulating film 13. In addition, the first distance T1 as the distance from the upper end of the gate insulating film 13 to the lower end of the conductive film 113 is smaller than the second distance T5 as the distance from the upper end of the gate insulating film 13 to the upper end of the semiconductor layer 24.

2.2. Manufacturing Method

A manufacturing method for the transistor of the second embodiment will be described with reference to FIGS. 10 and 11.

Figure 10:
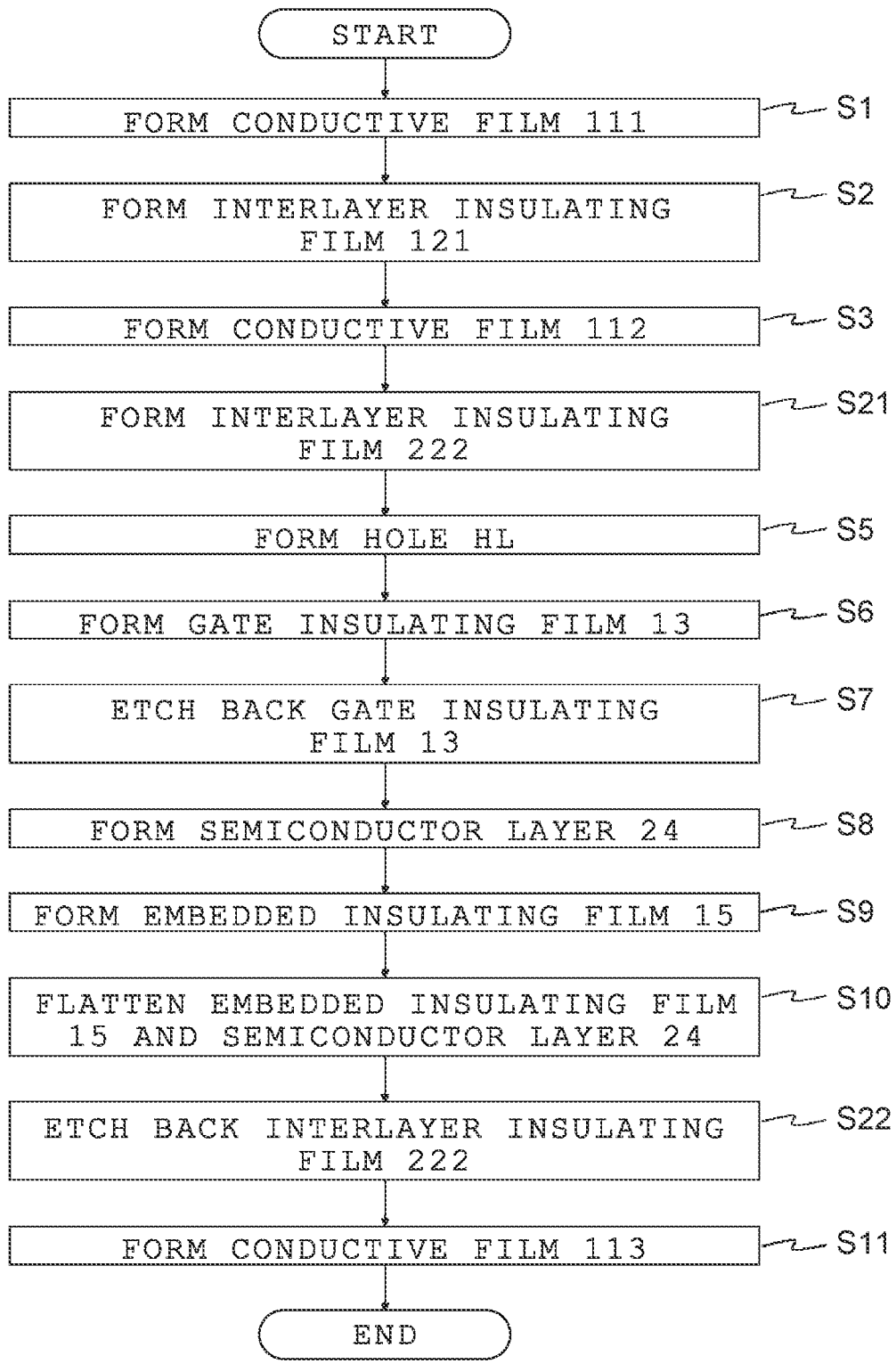
FIG. 10 is a flowchart illustrating an example of a manufacturing method for the transistor of the second embodiment.

FIG. 10 is a flowchart illustrating an example of the manufacturing method for the transistor of the second embodiment. FIG. 11 is a process diagram illustrating an example of the manufacturing method for the transistor of the second embodiment. Hereinafter, an example of the manufacturing method for the transistor 20 according to the second embodiment will be described from the formation of the conductive film 111 as the lower electrode BE to the formation of the conductive film 113 as the upper electrode TE with reference to FIGS. 10 and 11.

Up to Step S3 (FIG. 7C) is the same as in the first embodiment.

Figure 11A:
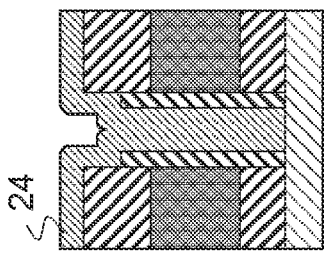
FIGS. 11A-11I are process diagrams illustrating an example of the manufacturing method for the transistor of the second embodiment.

First, in Step S21, the interlayer insulating film 222 is formed as illustrated in FIG. 11A. The interlayer insulating film 222 is partially removed in Step S22 to be described later, and thus the interlayer insulating film 222 is formed thicker than the interlayer insulating film 122 of the first embodiment.

Figure 11B:
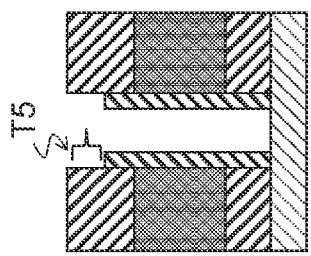
Figure 11C:
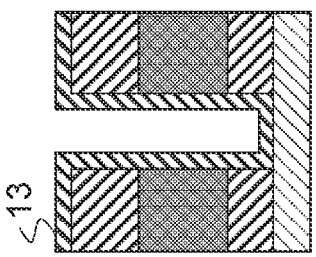

Subsequently, Steps S5 to S6 are performed similarly to the first embodiment as illustrated in FIGS. 11B to 11C.

Figure 11D:
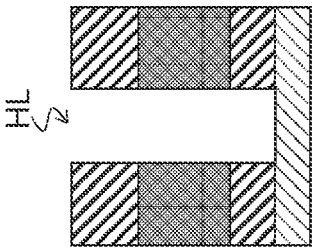

Next, in Step S7, the gate insulating film 13 formed on, for example, each of the interlayer insulating film 222 and the upper surface of a part of the conductive film 111 as the bottom surface of the hole HL is removed by anisotropic etching such as RIE. Then, as illustrated in FIG. 11D, the gate insulating film 13 at a part of the side wall of the hole HL is removed by etch back. In at least one embodiment, the gate insulating film 13 on the side wall of the hole HL is removed up to the position where the distance from the upper end of the interlayer insulating film 222 to the upper end of the gate insulating film 13 is the second distance T5. As a result, the height of the semiconductor layer 24 becomes higher than the height of the gate insulating film 13 by a process to be described later. After the etch back, the upper surface of the interlayer insulating film 222 may be flattened by chemical mechanical polishing (CMP).

Figure 11E:
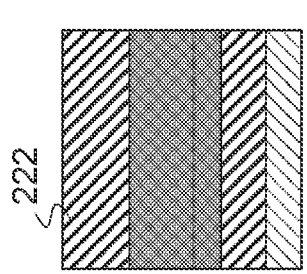
Figure 11F:
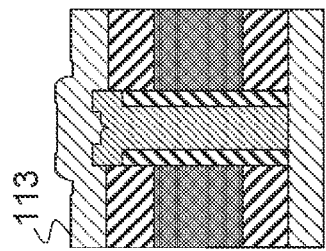
Figure 11G:
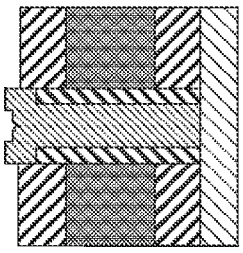

Subsequently, Steps S8 to S10 are performed similarly to the first embodiment as illustrated in FIGS. 11E to 11G.

Figure 11H:
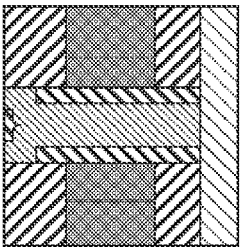

Next, in Step S22, a part of the interlayer insulating film 222 and the embedded insulating film 15 are removed by etch back as illustrated in FIG. 11H. For example, the interlayer insulating film 222 and the embedded insulating film 15 are removed at the position higher by the first distance T1 than the upper end of the gate insulating film 13. Specifically, in at least one embodiment, the interlayer insulating film 222 is removed so as to be higher than the lower end of the recess portion of the semiconductor layer 24 and lower than the upper end of the semiconductor layer 24. All embedded insulating film 15 is removed. Accordingly, the height of the semiconductor layer 24 becomes higher than that of the interlayer insulating film 222 and the side surface of the semiconductor layer 24 is exposed in part. In addition, by removing a part of the interlayer insulating film 222 up to a position higher than the lower end of the recess portion of the semiconductor layer 24, it is possible to avoid problems such as leakage current generation while increasing the area of contact between the recess portion of the semiconductor layer 24 and the conductive film 113 as the upper electrode TE. In at least one embodiment, all embedded insulating films 15 is removed, but a part of the embedded insulating film 15 may be removed, and a part of the embedded insulating film 15 may be formed in the recess portion.

Figure 11I:
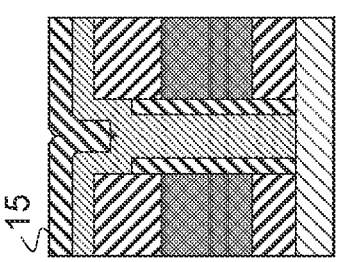

Then, as illustrated in FIG. 11I, the conductive film 113 is formed in Step 22 as in the first embodiment. As a result, the structure of the transistor 20 of the second embodiment described with reference to FIG. 9 is formed.

2.3. Effect

As described above, effects similar to those of the first embodiment can be obtained according to the present embodiment. In addition, since the upper electrode TE comes into contact with a part of the side surface of the semiconductor layer 24 and the recess portion of the semiconductor layer 24 in addition to the upper surface of the semiconductor layer 24, the area of contact between the semiconductor layer 24 and the upper electrode TE can be further increased and the current Id flowing through the channel of the transistor can be further increased as compared with the first embodiment. Further, the contact resistance Rcte on the upper electrode TE side can be further reduced as compared with the first embodiment, and thus the transistor characteristics can be expected to be further improved.

In addition, in a semiconductor memory device including the transistor 20 according to at least one embodiment, more power reduction than in the first embodiment can be achieved. Further, since the transistor characteristics can be expected to be further improved as compared with the first embodiment, the operating speed can be expected to be further improved as compared with the first embodiment. In addition, effects similar to those of the first embodiment can be obtained also in the manufacturing method for the transistor 20 according to the present embodiment.

3. Third Embodiment

Next, a third embodiment will be described. The third embodiment differs from the first embodiment in that the radius of the columnar portion PI decreases toward the lower electrode BE. The configuration is similar to that of the first embodiment except that the radius of the columnar portion PI decreases toward the lower electrode BE, and thus the same parts will be denoted by the same reference numerals with redundant description omitted.

3.1. Configuration

Figure 12:
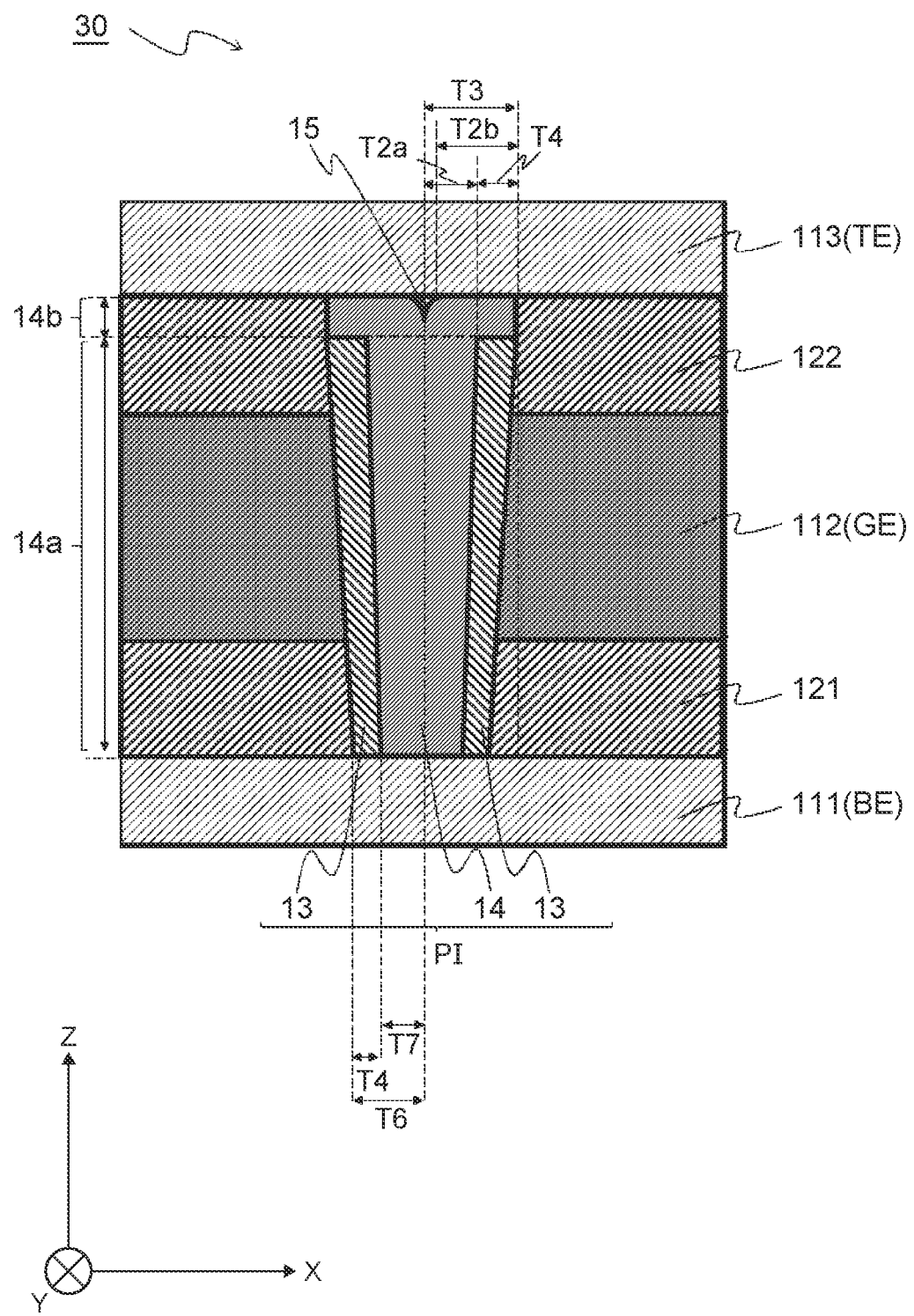
FIG. 12 is a cross-sectional view illustrating an example of the configuration of a transistor of a third embodiment.
Figure 16:
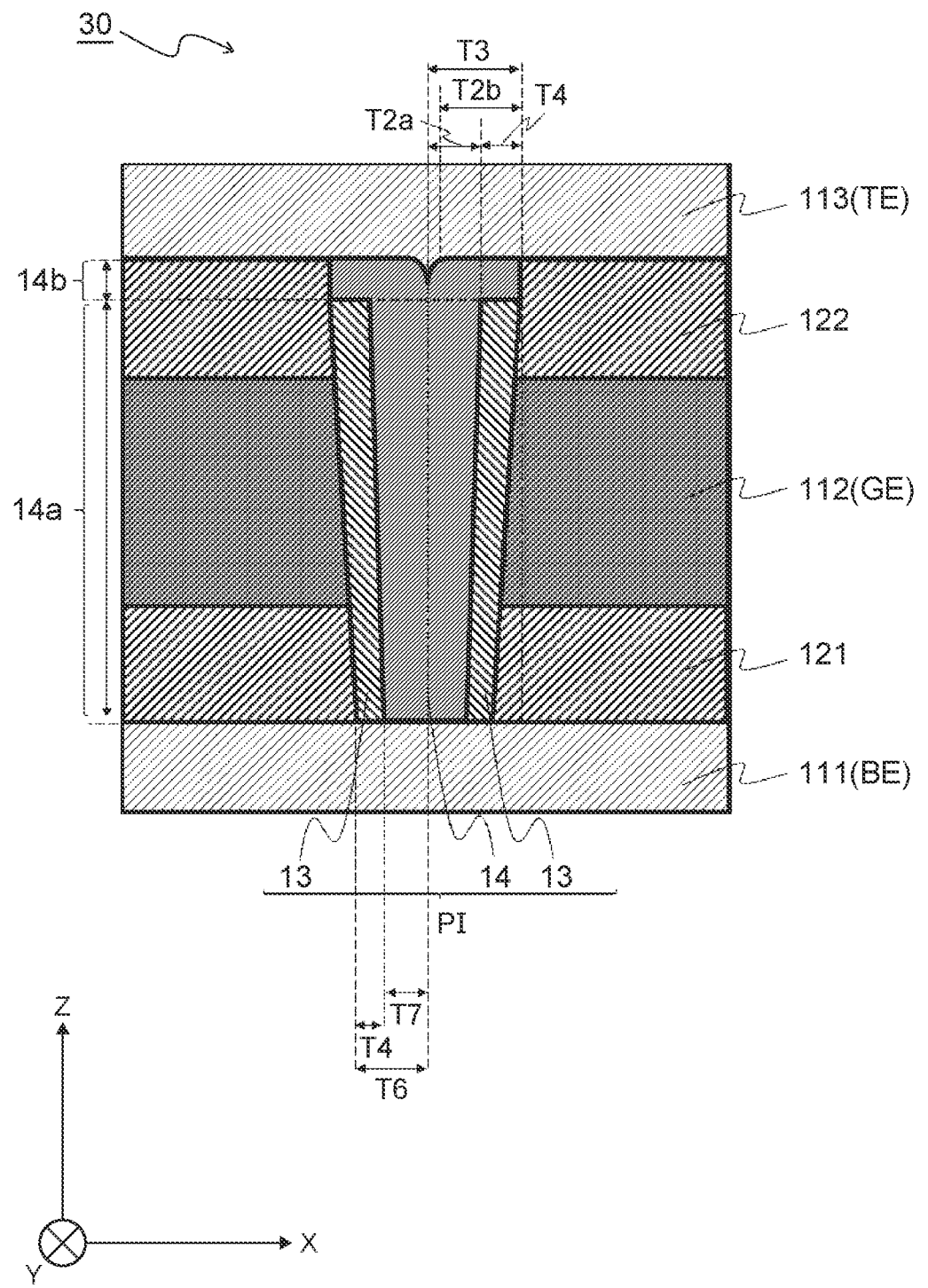
FIG. 16 is a perspective view schematically illustrating an example of the structure of a semiconductor memory device of an alternative example of the third embodiment.

The transistor of the third embodiment will be described with reference to FIG. 12 and Fid. 16. FIG. 12 is a cross-sectional view illustrating an example of the structure of the transistor of the third embodiment. FIG. 16 is a perspective view schematically illustrating an example of the structure of a semiconductor memory device of an alternative example of the third embodiment.

As illustrated in FIG. 12, a transistor 30 of the third embodiment includes the conductive film 111 as the lower electrode BE, the interlayer insulating film 121, the conductive film 112 as the gate electrode GE, the interlayer insulating film 122, the conductive film 113 as the upper electrode TE, and the columnar portion PI.

The diameter of the columnar portion PI decreases toward the conductive film 111 from the conductive film 113. Specifically, the radius of the columnar portion PI is T3 on the side of the conductive film 113 as the upper electrode TE and T6 on the side of the conductive film 111 as the lower electrode BE (T3>T6). In addition, as the radius of the columnar portion PI decreases, a film diameter T7 of the semiconductor layer 14 on the side of the conductive film 111 as the lower electrode BE is smaller than the film diameter T2a of the semiconductor layer 14 on the side of the conductive film 111 as the lower electrode BE of the transistor 10 of the first embodiment (T2a>T7). The fact that the diameter of the columnar portion PI decreases toward the conductive film 111 from the conductive film 113 can be rephrased as the cross-sectional area of the columnar portion PI in the XY direction decreasing toward the conductive film 111 from the conductive film 113. As shown in FIG. 16, the embedded insulating film 15 may not be formed in the recess portion.

3.2. Effect

As described above, effects similar to those of the first embodiment can be obtained according to the present embodiment. In addition, the radius of the semiconductor layer 14 on the upper electrode TE side of the columnar portion PI with respect to the diameter of the semiconductor layer 14 on the lower electrode BE side is larger than in the first embodiment. Accordingly, the area of contact of the semiconductor layer 14 on the upper electrode TE side with the upper electrode TE can be increased as compared with the first embodiment and the current Id flowing through the channel of the transistor can be further increased. Further, the contact resistance Rcte on the upper electrode TE side can be reduced as compared with the first embodiment and the transistor characteristics can be expected to be further improved.

In addition, in a semiconductor memory device including the transistor 30 according to the present embodiment, more power reduction than in the first embodiment can be achieved. Further, since the transistor characteristics can be expected to be further improved as compared with the first embodiment, the operating speed can be expected to be further improved as compared with the first embodiment. In addition, effects similar to those of the first embodiment can be obtained also in the manufacturing method for the transistor 30 according to the present embodiment.

4. Fourth Embodiment

Next, a fourth embodiment will be described. The fourth embodiment differs from the first embodiment in that the transistor is used in a peripheral circuit. The configuration is similar to that of the first embodiment except that the transistor is used in a peripheral circuit, and thus the same parts will be denoted by the same reference numerals with redundant description omitted.

In addition, in the present embodiment, reference numerals without alphabetic suffixes will be used when the components indicated by reference numerals with different alphabetic suffixes do not have to be distinguished from each other.

4.1. Configuration

Figure 13:
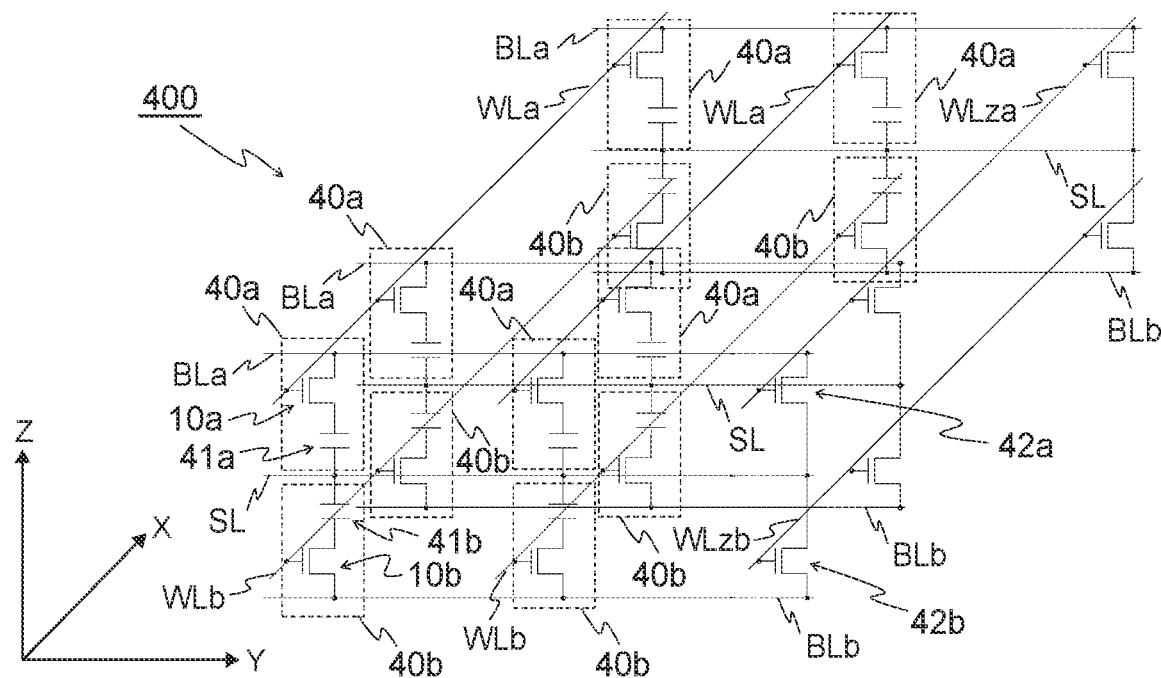
FIG. 13 is a circuit diagram illustrating an example of the configuration of a memory cell array of a semiconductor memory device of a fourth embodiment.

FIG. 13 is a circuit diagram illustrating an example of the configuration of the memory cell array of the semiconductor memory device of the fourth embodiment. In the present embodiment, the semiconductor memory device is, for example, a volatile semiconductor memory device such as a dynamic random access memory (DRAM).

The semiconductor memory device includes a memory cell array 400. As illustrated in FIG. 13, the memory cell array 400 includes a memory cell 40 (40a, 40b), the word line WL (WLa, WLb), the bit line BL (BLa, BLb), the source line SL, and a dummy cell 42 (42a, 42b).

The word line WL is connected in common to the memory cells 40 adjacent to each other in the X direction. The bit lines BL are located at predetermined intervals in the X direction with the Y direction, which intersects with the X direction, serving as a long side. In addition, the memory cell 40s adjacent to each other in the Y direction are connected to the common bit line BL. The source line SL is disposed with, for example, the Y direction serving as a long side.

In the present embodiment, the memory cell 40 includes the transistor 10 and a capacitor 41.

One terminal of the transistor 10 is connected to the bit line BL. The other terminal of the transistor 10 is connected to one terminal of the capacitor 41. The other terminal of the capacitor 41 is connected to the source line SL. In addition, the gate of the transistor 10 is connected to the word line WL.

The dummy cell 42 (42a, 42b) is provided in, for example, the end portion of the memory cell array 400 in the Y direction. One terminal of the dummy cell 42 is connected to the bit line BL. The other terminal of the dummy cell 42 is connected to the source line SL. The gate of the dummy cell 42a is connected to a word line WLza. The gate of the dummy cell 42b is connected to a word line WLzb. In addition, in the dummy cell 42, the capacitor 41 is not provided between the transistor 10 and the source line SL.

During operation with respect to the memory cell 40, the dummy cell 42 is set to the ON state in addition to the transistor 10. The dummy cell 42 contributes to the operation of the memory cell 40. The dummy cell 42 functions as a selection element of the memory cell 40. Specifically, for example, the dummy cell 42b is activated when the memory cell 40a between the bit line BLa and the source line SL is selected in response to the operation to be executed by the DRAM. On the other hand, the dummy cell 42a is activated when the memory cell 40b between the bit line BLb and the source line SL is selected. In this manner, during operation with respect to the memory cell 40, the capacitor 41 is connected to the two bit lines BLa and BLb via the transistor 10 and the dummy cell 42.

Figure 14:
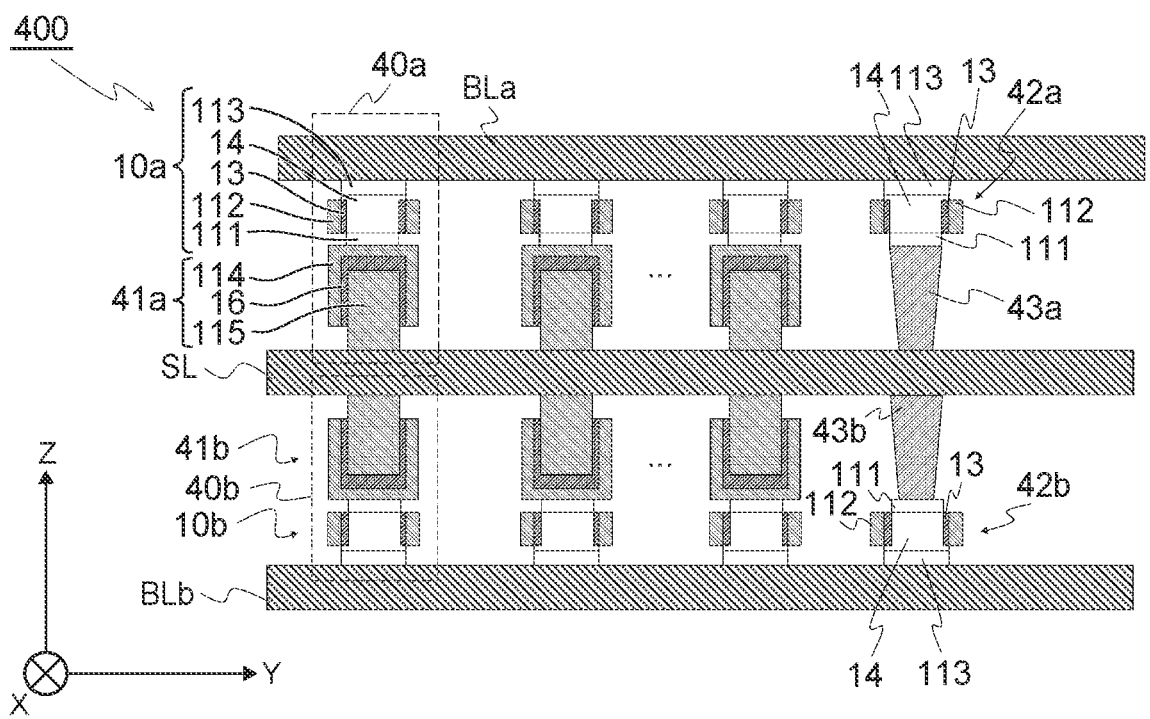
FIG. 14 is a cross-sectional view illustrating a configuration example of the memory cell array of the semiconductor memory device of the fourth embodiment.

FIG. 14 is a cross-sectional view illustrating an example of the configuration of the memory cell array of the semiconductor memory device of the fourth embodiment. A cross-sectional structure of the memory cell array 400 is schematically illustrated in FIG. 14. The insulating layer that covers the components of the DRAM is not illustrated in FIG. 14. The insulating film that covers the components of the DRAM is, for example, an interlayer insulating film.

As illustrated in FIG. 14, in the DRAM of the present embodiment, the memory cell array 400 is provided above a substrate (not illustrated). A transistor 10b is provided above the bit line BLb. A capacitor 41b is provided above the transistor 10b. The source line SL is provided above the capacitor 41b. A capacitor 41a is provided above the source line SL. A transistor 10a is provided above the capacitor 41a. The bit line BLa is provided above the transistor 10a.

As described above, in the memory cell 40 of the DRAM of the present embodiment, the transistor 10 (10a, 10b) and the capacitor (41a, 41b) are stacked 41 perpendicularly to the surface of the substrate.

In the memory cell 40, the capacitor 41 (41a, 41b) includes a conductive film 114 and a conductive film 115 as capacitor electrodes and an insulating film 16 as a capacitor insulating film. The insulating film 16 is provided between the conductive film 114 and the conductive film 115. The insulating film 16 is a dielectric between the conductive film 114 and the conductive film 115. The capacitor 41 is capable of holding an electric charge. The capacitance of the capacitor 41 is appropriately set in accordance with the area of facing of the conductive films 114 and 115 as two capacitor electrodes, the dielectric constant of the material of the insulating film 16 as a capacitor insulating film, the film diameter of the insulating film 16 as a capacitor insulating film, and so on.

The transistor 10 (10a, 10b) includes the gate insulating film 13, the semiconductor layer 14, the conductive film 111 as the lower electrode BE, the conductive film 112 as the gate electrode GE, and the conductive film 113 as the upper electrode TE.

The configuration of the transistor 10 of the present embodiment is similar to that of the transistor of the first embodiment illustrated in FIG. 5, and thus detailed description thereof will be omitted.

In addition, as illustrated in FIG. 14, the dummy cell 42b is provided above the bit line BLb in the DRAM of the present embodiment. A contact plug 43b is provided above a dummy cell 24b. The source line SL is provided above the contact plug 43b. A contact plug 43a is provided above the source line SL. The dummy cell 42a is provided above the contact plug 43a. The bit line BLa is provided above the dummy cell 42a.

4.2. Effect

As described above, effects similar to those of the first embodiment can be obtained according to the present embodiment. In addition, use is possible not only in a nonvolatile semiconductor memory device such as the NAND flash memory illustrated in the first to third embodiments but also in a volatile semiconductor memory device such as the DRAM illustrated in the present embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure.

The accompanying claims and their equivalents are intended to cover such forms or modifications as would fall within the scope and spirit of the disclosure.

What is claimed is:

1. A transistor comprising:
   an upper electrode;
   a lower electrode;
   a gate electrode disposed between the upper electrode and the lower electrode;
   a columnar portion penetrating the gate electrode and disposed between the upper electrode and the lower electrode,
   wherein the columnar portion includes a tubular gate insulating film and a semiconductor layer, the tubular gate insulating film disposed at a first distance away from the upper electrode and in contact with the gate electrode, the semiconductor layer embedded in the tubular gate insulating film and disposed between the tubular gate insulating film and the upper electrode and being in contact with the upper electrode; and
   wherein at least a part of a side surface of a part of the semiconductor layer embedded between the tubular gate insulating film and the upper electrode is in contact with the upper electrode.

2. The transistor according to claim 1, wherein the first distance is equal to or less than a film diameter of a part of the semiconductor layer embedded in the tubular gate insulating film.

3. The transistor according to claim 1, wherein a film diameter of the part of the semiconductor layer embedded in the tubular gate insulating film, a film diameter of the part of the semiconductor layer embedded between the tubular gate insulating film and the upper electrode, and a radius of the columnar portion, have a relationship of $T2a < T2b < T3$ where $T2a$ is the film diameter of the part of the semiconductor layer embedded in the tubular gate insulating film, $T2b$ is the film diameter of the part of the semiconductor layer embedded between the tubular gate insulating film and the upper electrode, and $T3$ is the radius of the columnar portion.

4. The transistor according to claim 1, wherein the semiconductor layer includes an oxide semiconductor.

5. The transistor according to claim 4, wherein the semiconductor layer contains oxygen, indium, gallium, and zinc.

6. The transistor according to claim 4, wherein the semiconductor layer contains at least one of indium, zinc, or tin.

7. The transistor according to claim 1, wherein the semiconductor layer includes a recess portion in a middle on an upper electrode side, wherein at least a part of the recess portion of the semiconductor layer comes into contact with the upper electrode.

8. The transistor according to claim 1, wherein the columnar portion is tapered.

9. A semiconductor memory device comprising the transistor according to claim 1.

10. The semiconductor memory device according to claim 9, wherein the transistor includes a transistor of a NAND flash memory.

11. The semiconductor memory device according to claim 9, wherein the transistor is a transistor of a dynamic random access memory (DRAM).

12. The transistor according to claim 1, wherein the semiconductor layer includes a channel.

13. The transistor according to claim 8, wherein a radius of the columnar portion decreases toward the lower electrode.

* * * * *